(12) United States Patent
Chuang

(10) Patent No.: US 6,943,607 B2
(45) Date of Patent: Sep. 13, 2005

(54) METHOD AND DEVICE FOR GENERATING DELAY SIGNAL

(75) Inventor: Ying-Lang Chuang, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/672,406

(22) Filed: Sep. 26, 2003

(65) Prior Publication Data

US 2004/0085113 A1 May 6, 2004

(30) Foreign Application Priority Data

Oct. 2, 2002 (TW) .......................................... 9112275 A

(51) Int. Cl.$^7$ .............................................. H03H 11/26
(52) U.S. Cl. ......................................... 327/263; 327/99
(58) Field of Search .......................... 327/99, 105, 107, 327/172–176, 261–265, 276–279, 291–292, 298–299, 407, 284–286

(56) References Cited

U.S. PATENT DOCUMENTS

| | | | | | |
|---|---|---|---|---|---|
| 5,534,808 | A | * | 7/1996 | Takaki et al. ................ | 327/261 |
| 5,789,958 | A | * | 8/1998 | Chapman et al. ........... | 327/261 |
| 5,923,613 | A | * | 7/1999 | Tien et al. ................... | 365/233 |
| 6,037,817 | A | * | 3/2000 | Paulus et al. ................ | 327/265 |
| 6,396,321 | B1 | * | 5/2002 | Watanabe et al. ............ | 327/158 |
| 6,690,219 | B2 | * | 2/2004 | Chuang ....................... | 327/176 |
| 6,696,897 | B1 | * | 2/2004 | Kong et al. ................... | 331/45 |

* cited by examiner

Primary Examiner—My-Trang Nu Ton
(74) Attorney, Agent, or Firm—Madson & Metcalf

(57) ABSTRACT

For generating a delay signal, a series of source signals based on the same high frequency signal are first provided. Every adjacent two of the source signals have a phase difference of a certain clock unit therebetween. A first and a second output signals are then generated on the basis of the plurality of source signals at a first and a second time points selected as desired. The first and the second output signals are processed by a logic operation to obtain the accurate and adjustable delay signal. For obtaining the first and the second output signals, the source signals are duplicated at first, and then respectively processed in response to respective clock signals.

31 Claims, 11 Drawing Sheets

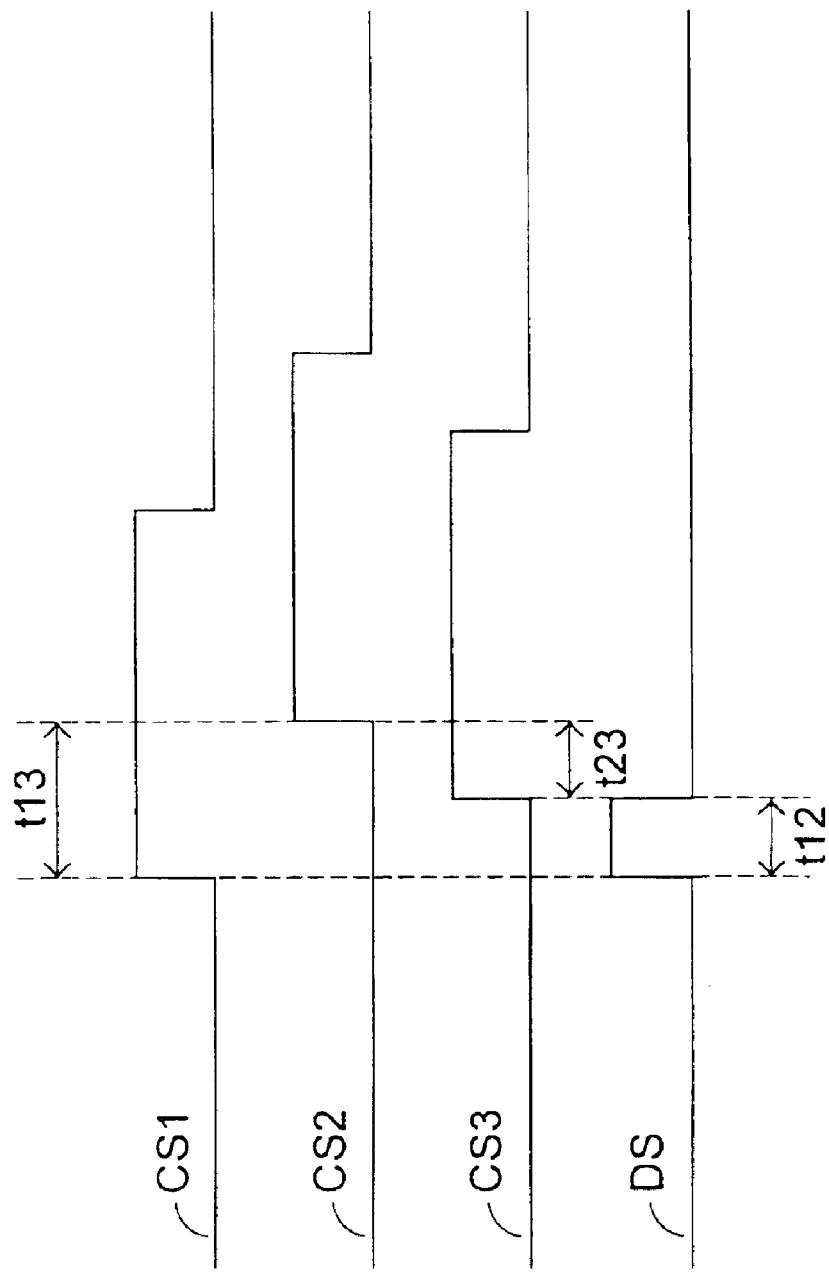

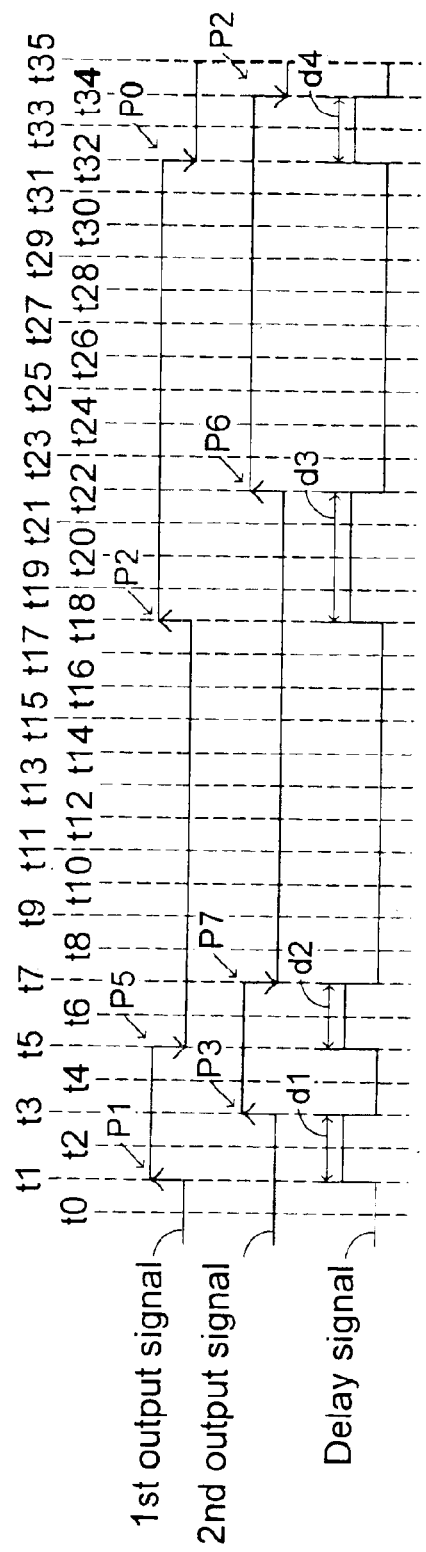
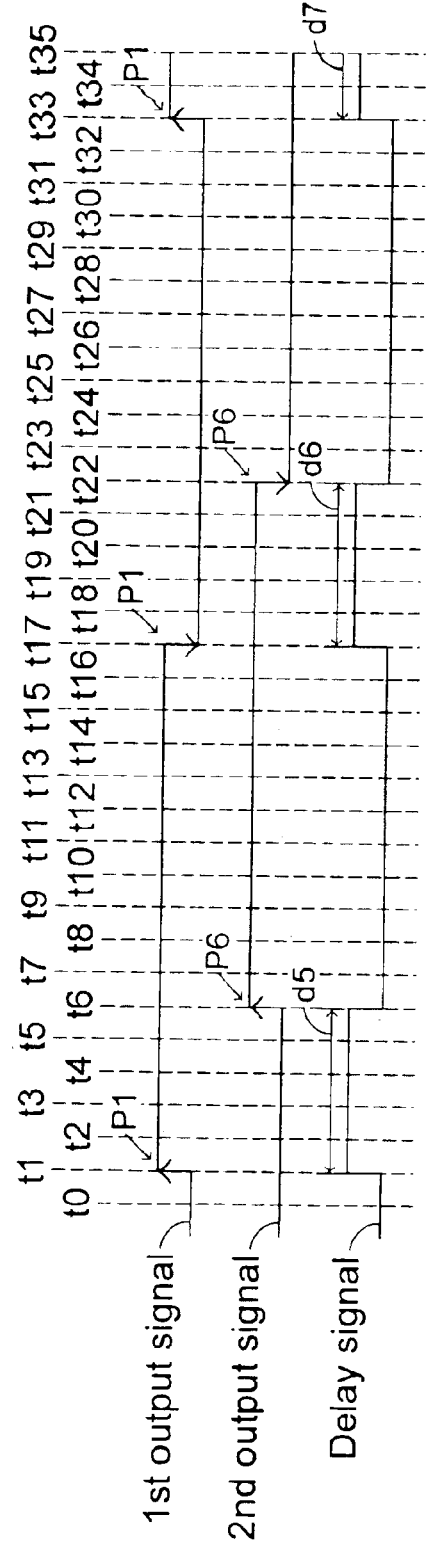
Fig.2B
Fig.2C

METHOD AND DEVICE FOR GENERATING DELAY SIGNAL

FIELD OF THE INVENTION

The present invention relates to a method and a device for generating a delay signal, and more particularly to a method and a device for generating an accurate and adjustable delay signal under a high-frequency system.

BACKGROUND OF THE INVENTION

Many problems in microprocessor design arise with the increasing operational speed, of the microprocessor. For example, synchronizing signals crossing different chips is a big issue to be solved.

Please refer to FIG. 1A, in which a chip scheme consisting of three chips is exemplified. The signals crossing the chips are illustrated in FIG. 1B. The way for the third chip C3 to receive a cross-chip signal from the first chip C1 can be a direct path from the first chip C1 or a path through the second chip C2. That is, the first chip C1 directly transmits a cross-chip signal CS3 to the third chip C3, or the first chip C1 transmits a first cross-chip signal CS1 to the second chip C2, and then the second chip C2 transmits a second cross-chip signal CS2 to the third chip C3. It is assumed that the cross-chip signal CS2 is transmitted to the third chip C3 after a time period t13. Generally, it is required that the cross-chip signal CS2 has to synchronize the cross-chip signal CS3 or be kept a constant phase difference t23 from the cross-chip signal CS3 as shown in FIG. 1B.

In prior art, a delay cell (not shown) is used to generate a delay signal DS to the first chip C1 to result in a constant delay period t12 of the cross-chip signal CS3, thereby maintaining the desired phase difference of t23 between the cross-chip signals CS2 and CS3. However, the cross-chip signal CS2 is generated after the transmission of the cross-chip signal S1 from the first chip C1 to the second chip C2, and it is difficult in practice to determine the accurate time for the cross-chip signal CS2 to reach the third chip C3. Many uncertain factors have to be taken into considerations. The uncertain factors include pad delay, PCB (printed circuit board) delay, and any other factors resulting from manufacturing processes or layout. The constant delay of the delay cell cannot flexibly follow the possible change of the actual time for the cross-chip signal CS2 to reach the third chip C3 due to the uncertain factors, particularly arising for the manufacturing processes or layout. Accordingly, the desired constant phase difference t23 between the cross-chip signals CS2 and CS3 cannot be assured of. In a high-frequency system, the misaligning problem is even significant. As is understood, the acceptable deviation is relatively low in a high-frequency system. The inaccurate phase difference t23 between the cross-chip signals CS2 and CS3 is subject to the error function of the third chip C3.

SUMMARY OF THE INVENTION

Therefore, it is an object of the present invention to provide a device and a method for generating an accurate and adjustable delay signal so as to assure of the desired constant phase difference between the cross-chip signals in a high-frequency system.

A first aspect of the present invention relates to a method for generating a delay signal. The method comprises steps of: providing a plurality of source signals, every adjacent two of which have a phase difference of a certain clock unit; generating a first and a second output signals at a first and a second time points based on the plurality of source signals; and processing the first and the second output signals by a logic operation to obtain the delay signal.

Preferably, the plurality of source signals are generated from a high-frequency signal by a phase-locked loop (PLL) device. The plurality of source signals can be a series of increasingly lagging signals or a series of increasingly leading signals.

In one embodiment, the logic operation is an XOR operation.

In one embodiment, the step of generating the first and the second output signals comprises sub-steps of: deriving a first and a second signal groups from the plurality of source signals; selecting a signal from the first signal group at the first time point as the first output signal; and selecting a signal from the second signal group at the second time point as the second output signal.

Preferably, the first and the second signal groups are obtained by duplicating the plurality of source signals.

Preferably, the first and the second time points are predetermined, and located by counting operations in response to a first and a second clock signals, respectively.

Preferably, the first output signal is generated based on the same first edges of selected two of the plurality of source signals, and the second output signal is generated based on the same second edges of selected two of the plurality of source signals. For example, the first and the second edges are both rising edges.

Preferably, a delay period of the delay signal is determined by the same third edges of the first and the second output signals. The third edges can be both rising edges or both falling edges.

In one embodiment, the first and the second signal groups are divided into a first and a second plurality of signal sub-groups, and the first and the second output signals are generated from one of the first plurality of signal sub-groups and one of the second plurality of signal sub-groups, respectively.

Preferably, all source signals in the selected one of the first plurality of signal sub-groups are at the same first level at the first time point, and all source signals in the selected one of the second plurality of signal subgroups are at the same second level at the second time point. For example, the first and the second levels are both low levels.

A second aspect of the present invention relates to a device for generating a delay signal. The device comprises a source-signal generator generating and outputting N counts of source signals in response to a high frequency signal, every adjacent two of the N counts of source signals having a phase difference of a certain clock unit; a source-signal selector coupled to the source-signal generator, and selecting a first and a second ones of the N counts of source signals to be outputted at a first and a second time points in response to a first and a second clock signals as a first and a second output signals, respectively, and a logic operator coupled to the source-signal selector, and logically operating the first and the second output signals to obtain the delay signal.

In one embodiment, the source-signal generator is a phase-locked loop (PLL) device.

In one embodiment, the source-signal selector includes: a selection-signal generating circuit generating a first and a second selection signal sets in response to the N counts of source signals and the first and the second clock signals; a first multiplexing circuit coupled to the selection-signal generating circuit, and allowing the first one of the N counts of source signals to be outputted as the first output signal in response to the first selection signal; and a second multiplexing circuit coupled to the selection-signal generating circuit, and allowing the second one of the N counts of source signals to be outputted as the second output signal in response to the second selection signal.

In one embodiment, the first multiplexing circuit includes M1 counts of multiplexers receiving different portions of the N counts of source signals, respectively, and allowing M1 onesamong the N counts of source signals to be outputted as M1 counts of multiplexing output signals in response to M1 counts of selection signals included in the first selection signal set, and the second multiplexing circuit includes M2 counts of multiplexers for receiving different portions of the N counts of source signals, respectively, and allowing M2 ones among the N counts of source signals to be outputted as M2 counts of multiplexing output signals in response to M2 counts of selection signals included in the second selection signal set.

Preferably, the source-signal selector further includes: a first signal synthesizing circuit coupled to the first multiplexing circuit for synthesizing the M1 counts of multiplexing output signals into the first output signal; and a second signal synthesizing circuit coupled to the second multiplexing circuit for synthesizing the M2 counts of multiplexing output signals into the second output signal.

In one embodiment, each of the first and the second signal synthesizing circuits includes an OR gate.

Alternatively, the first signal synthesizing circuit includes: M1 counts of AND gates coupled to the selection-signal generating circuit, the M1 counts of multiplexers and the source-signal generator, performing an AND operation of M1 counts of decoding signals, the M1 counts of multiplexing output signals and M1 counts of specific signals, and outputting M1 counts of gate output signals, respectively; and a first OR gate coupled to the M1 counts of AND gates, and performing a first OR operation of the M1 counts of gate output signals to obtain the first output signal. The second signal synthesizing circuit includes: M2 counts of AND gates coupled to the selection-signal generating circuit, the M2 counts of multiplexers and the source-signal generator, performing an AND operation of M2 counts of decoding signals, the M2 counts of multiplexing output signals and M2 counts of specific signals, and outputting M2 counts of gate output signals, respectively; and a second OR gate coupled to the M2 counts of AND gates, and performing a second OR operation of the M2 counts of gate output signals to obtain the second output signal.

In one embodiment, each of the M1 counts of specific signals is identical to one of the source signals, and kept at least P counts of clock cycles of the first clock signal leading or lagging all the source signals inputted into the corresponding multiplexer, and each of the M2 counts of specific signals is identical to one of the source signals, and kept at least P counts of clock cycles of the second clock signal leading or lagging all the source signals inputted into the corresponding multiplexer.

For example, N=32, M1=4, M2=4 and P=4.

In one embodiment, the selection-signal generating circuit comprises: a first selection signal decoder generating the M1 counts of decoding signals in response to the first clock signal; M1 counts of operating units, each coupled to the first selection signal decoder and outputting an output control signal in response to one of the M1 counts of decoding signals and (N/M1) ones of the N counts of source signals; M1 counts of output units, each coupled to the first selection signal decoder and one of the M1 counts of operating units, and outputting one of the M1 counts of selection signals in response to the first clock signal, one of the M1 counts of decoding signals and one of the M1 counts of output control signals; a second selection signal decoder generating the M2 counts of decoding signals in response to the second clock signal; M2 counts of operating units, each coupled to the second selection signal decoder and outputting an output control signal in response to one of the M2 counts of decoding signals and (N/M2) ones of the N counts of source signals; M2 counts of output units, each coupled to the second selection signal decoder and one of the M2 counts of operating units, and outputting one of the M2 counts of selection signals in response to the second clock signal, one of the M2 counts of decoding signals and one of the M2 counts of output control signals;

Preferably, each of the M1 operating units is an OR gate for performing an OR operation of the (N/M1) ones of the N counts of source signals, and each of the M2 counts of operating units is an OR gate for performing an OR operation of the (N/M2) ones of the N counts of source signals.

Preferably, each of the M1 and M2 counts of output units is a transparent latch.

In one embodiment, the logic operator comprises: a storage unit for storing therein the first and the second output signals; and a logic operation unit coupled to the storage unit and logically operating the first and the second output signals to obtain the delay signal.

Preferably, the storage unit includes a first and a second T flip-flops for storing therein the first and the second output signals, respectively, and the logic operation unit is an XOR gate.

Alternatively, the storage unit includes a first and a second R-S latches for storing therein the first and the second output signals, respectively, and the logic operation unit is an XOR gate.

BRIEF DESCRIPTION OF THE DRAWINGS

The present invention may best be understood through the following description with reference to the accompanying drawings, in which:

FIG. 1B is a waveform diagram schematically showing the relationship among the signals shown in FIG. 1A;

FIGS. 2B and 2C are waveform diagrams schematically illustrating two examples of delay signals with different periods, in which the periods of the delay signals are determined by a first and a second output signals obtained in response to the series of source signals of FIG. 2A;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 2A:
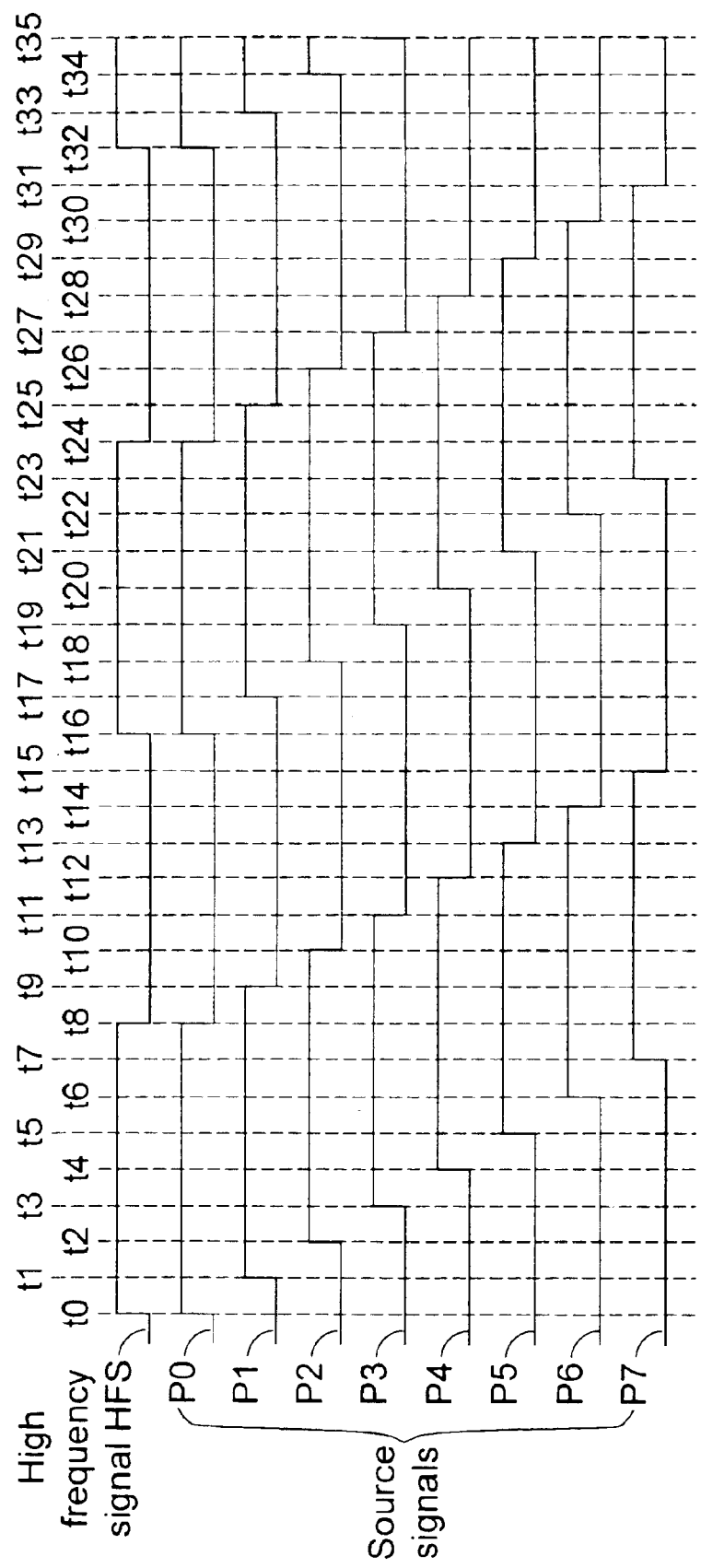
FIG. 2A is a waveform diagram schematically showing a series of source signals generated in response to a high frequency signal for use in the present invention.

For generating a delay signal, a series of source signals based on the same high frequency signal are first provided. Every adjacent two of the source signals have a phase difference of a certain clock unit therebetween. For example, a phase-locked loop (PLL) device is used to generate the series of source signals, and eight increasingly lagging source signals P0~P7 are shown in FIG. 2A. A first and a second output signals are then generated on the basis of the plurality of source signals at a first and a second time points. By properly setting the output timing of the first and the second signals, a delay signal with an accurate and adjustable period can be obtained, which will be described hereinafter with reference to FIGS. 2B and 2C.

Referring to FIG. 2B, it is set that that two of the source signals, e.g. P1 and P3, are selected to be outputted at the time points t1 and t3 so that the first and the second output signals toggle at the time points t1 and t3, which are located within the first positive half-cycle of the high frequency signal, respectively. Then, the first and the second signal are processed with a logic operation, e.g. an XOR operation to obtain a delay signal with a delay period d1. Likewise, the source signals P5 and P7 are selected to be outputted at time points t5 and t7 to toggle the first and the second output signals again. The XOR operation of the first and the second signals results in another delay signals with a delay period d2. Similarly, when source signals P2 and P6 are selected to be outputted at time points t18 and t22, which are located within the second positive half-cycle of the high frequency signal, a delay signal with a larger delay period d3 can be obtained. When source signals P0 and P2 are selected to be outputted at time points t32 and t34, which are located within the third positive half-cycle of the high frequency signal, a delay signal with a delay period d4 can be obtained. Therefore, in this manner, the delay period is accurate and adjustable as desired.

Figure 1A:
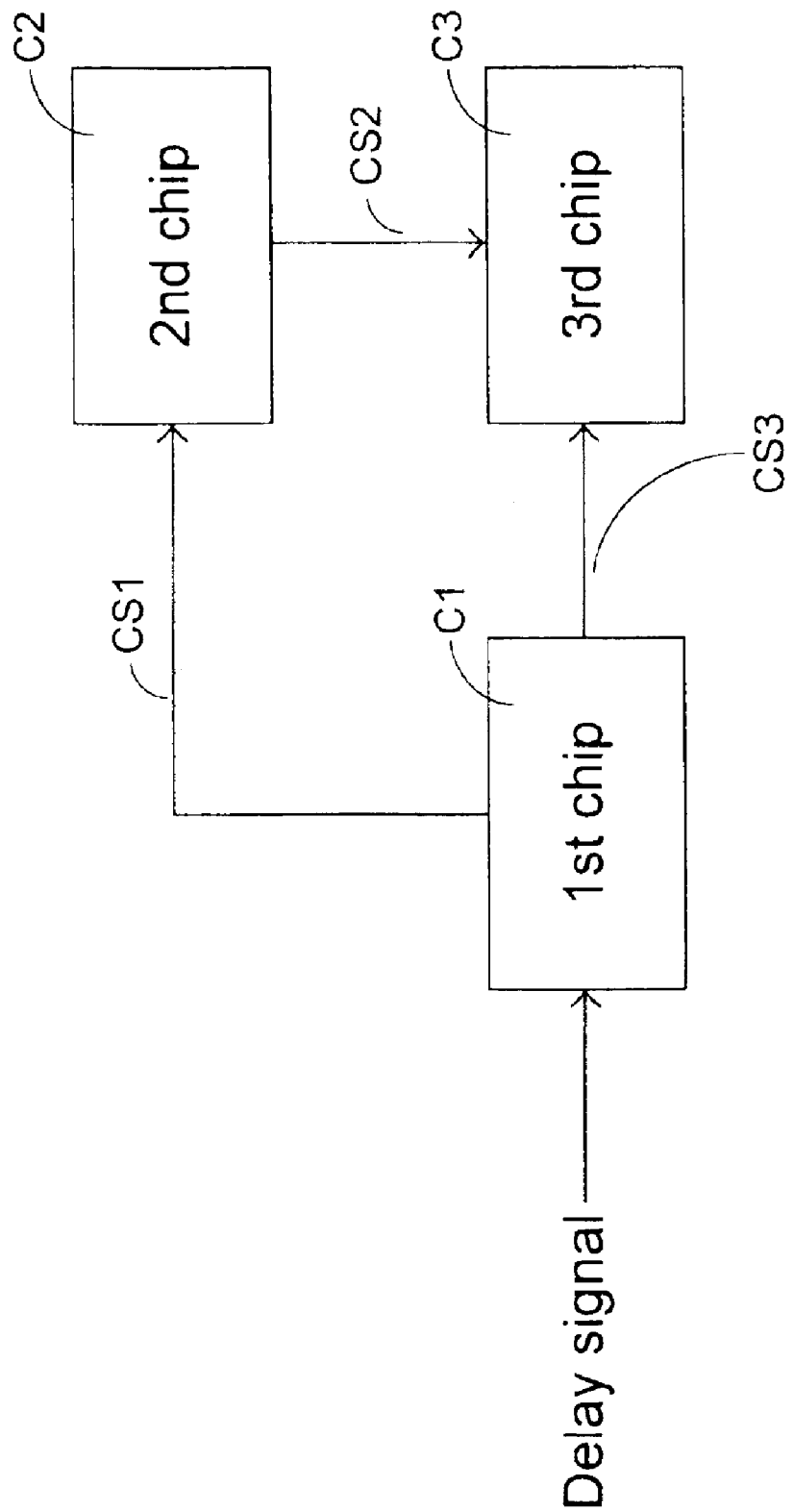
FIG. 1A is a scheme illustrating three inter-related chips.

The selection and output of different pairs of source signals differentiate the delay period as described above. Therefore, the time deviation resulting from the uncertain factors and unable to be solved in the prior art can be compensated by properly adjusting the delay period of the delay signal according to the present invention. In other words, the phase difference t23 between the cross-chip signals CS2 and CS3 as shown in FIGS. 1A and 1B can be made constant.

Of course, if the delay periods for any of the positive half cycles of the high frequency signal are required to be constant, the same pairs of source signals can be used for all cycles to achieve this purpose. For example, when a constant delay period of 5 clock cycles is required, source signals, P1 and P6 can be selected to toggle the first and the second output signals at time points (t1, t6), (t17, t22), (t33, t38), . . . . After the XOR operation of the first and the second output signals, equal and accurate delay periods d5, d6, d7, . . . can be obtained.

As for the process of generating the first and the second output signals in response to the selected source signals, an example will be described hereinafter with reference to the simplified flowchart of FIG. 3.

After the series of source signals as shown in FIG. 2A are generated in response to a high frequency signal (Step 31), the source signals are copied to include a first and a second signal groups (Step 32). In response to a first clock signal, one of the source signals in the first signal group is selected to be outputted as the first output signal at a first point (Step 33). Likewise, one of the source signals in the second signal group is selected to be outputted as the first output signal at a first point in response to a second clock signal (Step 34).

In order to avoid the toggling operation contributing to the selection and output of source signals affects the electric levels of the first and the second output signals, it is preferred that the first and the second signal groups are further divided into several sub-groups, respectively. For example, there are N counts of source signals generated in response to the high frequency signal, and duplicated to include N counts of source signals in the first signal group and identical N counts of source signals in the second signal group. The N counts of source signals in the first signal group are further divided into M1 counts of subgroups, each of which includes (N/M1) source signals. Likewise, the N counts of source signals in the second signal group are further divided into M2 counts of sub-groups, each of which includes (N/M2) source signals.

Since all source signals in a selected one of the M1 counts of sub-groups and all source signals in a selected one of the M2 counts of sub-groups are kept at the same low level for generating the first and the second output signals, respectively, the electric levels of the first and the second output signals would not be affected by the toggling operation during the selection and output of the source signals.

Figure 3:
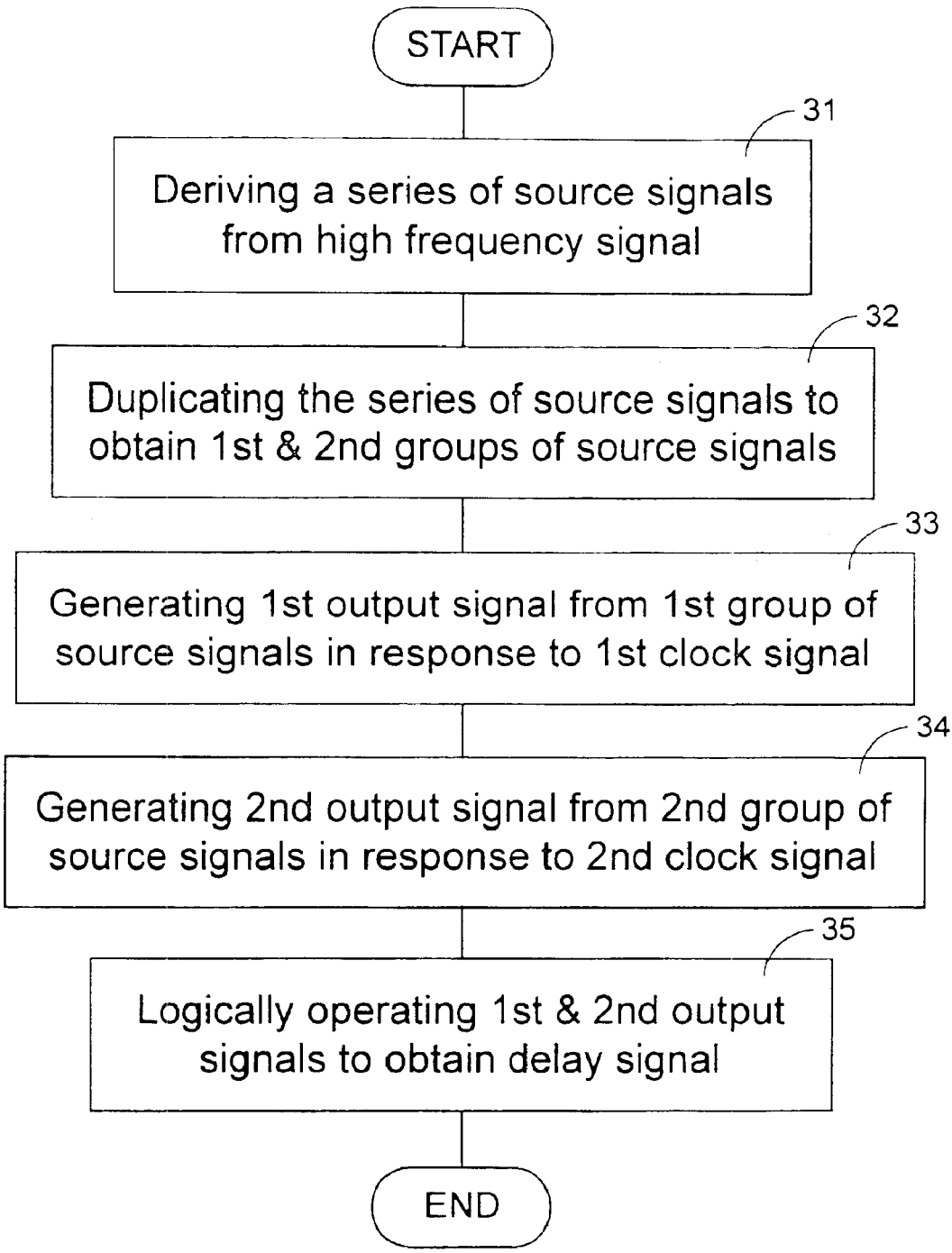
FIG. 3 is a flowchart for schematically illustrating a method for generating a delay signal according to an embodiment of the present invention.

The first and the second output signals are then processed by the XOR operation to determine the delay period (FIG. 3, Step 35).

Figure 4:
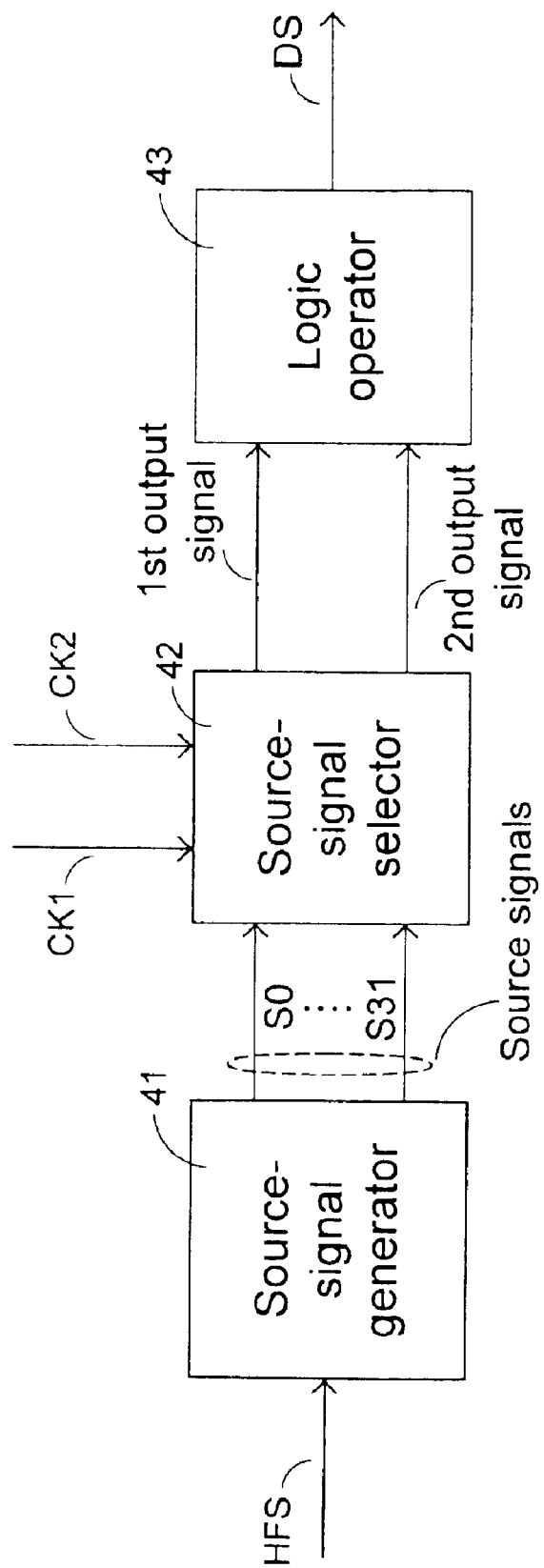
FIG. 4 is a block diagram schematically illustrating a device for generating a delay signal according to an embodiment of the present invention.

A device for generating a delay signal in response to a multiple signal source based on the above conception is referred to FIG. 4. The device comprises a source-signal generator 41, a source-signal selector 42 and a logic operator 43. In order to describe the present invention clearly, the symbols N, M1 and M2 appearing in FIG. 3 are exemplified as 32, 4 and 4, respectively. In other words, the source-signal generator 41 generates and outputs 32 source signals S0~S31 in response to a high frequency signal HFS, and every adjacent two of the 32 source signals S0~S31 have a phase difference of one clock unit, as are similar to the signals shown in FIG. 2A. The source-signal selector 42 is coupled to the source-signal generator 41 for receiving the source signals S0~S31, and duplicates the source signals S0~S31 into a first and a second signal groups. Each of the signal groups includes 32 source signals S0~S31. In response to a first clock signals CK1, one of the 32 source signals in the first signal group is selected and outputted at a first time point. In response to the second clock signals CK2, one of the 32 source signals in the second signal group is selected and outputted at a second time point. The first and the second time points are predetermined according to the required delay period, and located by counting operations in response to the first and the second clock signals, respectively. Then, the logic operator 43 coupled to the source-signal selector logically operates the first and the second output signals, e.g. by an XOR operation, to obtain the delay signal.

Figure 5A:
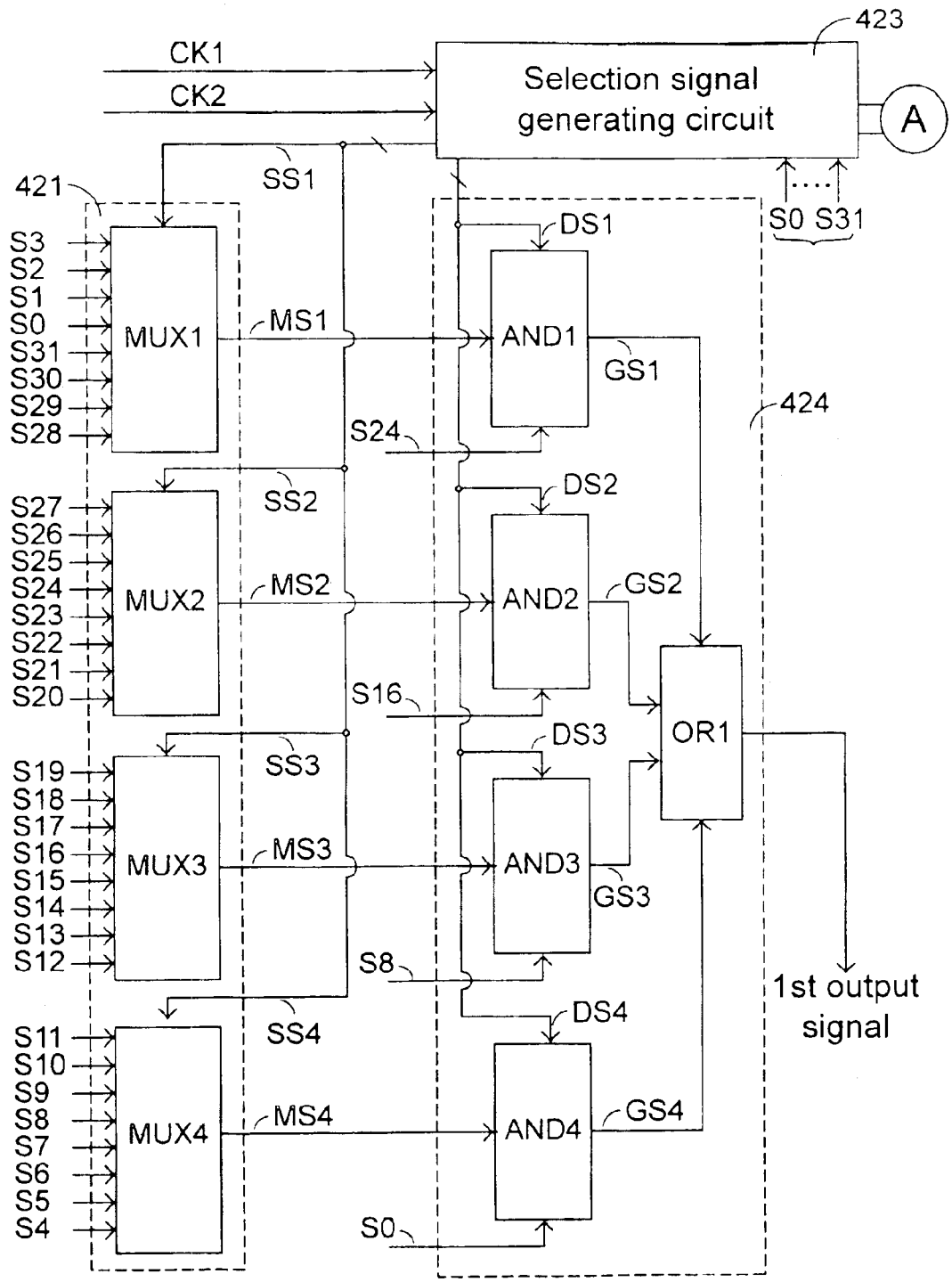
FIGS. 5A and 5B are block diagrams combined to exemplify the generation of the first and the second output signals of FIG. 4.
Figure 5B:
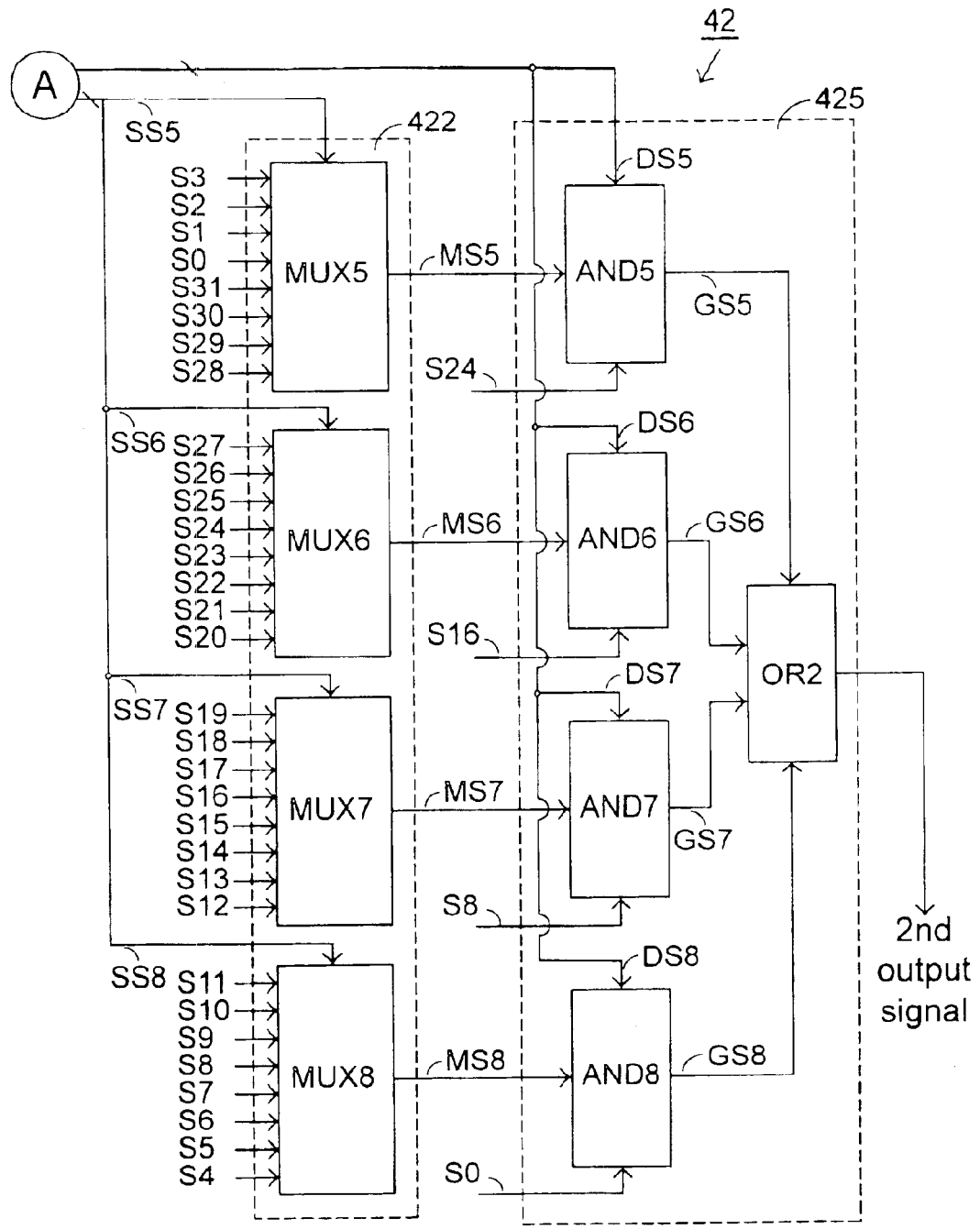

The embodiments and operations of the source-signal generator 41, the source-signal selector 42 and the logic operator 43 will be described hereinafter for further description of the present device. Please refer to FIGS. 5A and 5B that illustrates the source-signal selector 42 involving the generation of the first and the second output signals. The source-signal selector 42 comprises a first multiplexing circuit 421, a second multiplexing circuit 422, a selection-signal generating circuit 423, a first signal synthesizing circuit 424 and a second signal synthesizing circuit 425 interconnected as shown in the figures. The first multiplexing circuit 421 includes four multiplexers MUX1, MUX2, MUX3 and MUX4, and the first signal synthesizing circuit 424 includes four AND gates AND1, AND2, AND3 and AND4 and one OR gate OR1 (FIG. 5A). On the other hand, the second multiplexing circuit 422 includes four multiplexers MUX5, MUX6, MUX7 and MUX8, and the second signal synthesizing circuit 425 includes four AND gates AND5, AND6, AND7 and AND8 and one OR gate OR3 (FIG. 5B).

First of all, the 32 source signals S0~S31 generated by the source-signal generator 41 (FIG. 4) are duplicated and provided for both of the first multiplexing circuit 421 and the second multiplexing circuit 422. The 32 source signals S0~S31 are divided into four equal portions, wherein each portion includes eight non-repetitive source signals, and inputted into the four multiplexers MUX1, MUX2, MUX3 and MUX4, respectively. On the other hand, in response to the 32 source signals S0~S31 and a first and a second clock signals CK1 and CK2 inputted into the selection-signal generating circuit 423, a first and a second selection signal sets are generated. The first selection signal set includes four selection signals SS1, SS2, SS3 and SS4 provided for the four multiplexers MUX1, MUX2, MUX3 and MUX4, respectively. In response to respective selection signals SS1, SS2, SS3 and SS4, four source signals are selected and outputted by the four multiplexers MUX1, MUX2, MUX3 and MUX4, respectively, as multiplexing output signals MS1, MS2, MS3 and MS4. Afterwards, AND operations are performed by the AND gates AND1, AND2, AND3 and AND4. In the AND gate AND1, an AND operation of a first decoding signal DS1 from the selection-signal generating circuit 423, which will be described later, a specific source signal that is S24 in this example and will be described later, and the multiplexing output signal MS1 are performed to obtain a gate output signal GS1. In a similar way, gate output signals GS2, GS3 and GS4 can also be obtained by AND) operations of corresponding decoding signals DS2, DS3 and DS4, multiplexing output signals MS2, MS3 and MS4, and specific source signals S16, S8 and S0. The gate output signals GS1, GS2, GS3 and GS4 are further inputted into the first OR gate OR1 to be OR-operated, thereby obtaining the first output signal.

Likewise, the second selection signal set includes four selection signals SS5, SS6, SS7 and SS8 provided for the four multiplexers MUX5, MUX6, MUX7 and MUX8, respectively. In response to respective selection signals SS5, SS6, SS7 and SS8, four source signals are selected and outputted by the four multiplexers MUX5, MUX6, MUX7 and MUX8, respectively, as multiplexing output signals MS5, MS6, MS7 and MS8. Afterwards, AND operations are performed by the AND gates AND5, AND6, AND7 and AND8. In the AND gate AND5, an AND operation of a fifth decoding signal DS5 from the selection-signal generating circuit 423, which will be described later, a specific source signal that is S24 in this example and will be described later, and the multiplexing output signal MS5 are performed to obtain a gate output signal GS5. In a similar way, gate output signals GS6, GS7 and GS8 can also be obtained by AND operations of corresponding decoding signals DS6, DS7 and DS8, multiplexing output signals MS6, MS7 and MS8, and specific source signals S16, S8 and S0. The gate output signals GS5, GS6, GS7 and GS8 are further inputted into the second OR gate OR2 to be OR-operated, thereby obtaining the second output signal.

It is to be noted that the invention can work even if signal synthesizing circuits 424 and 425 do not include those AND gates AND1~AND8, and the OR gates OR1 and OR2 directly process the multiplexing output signals MS1~MS8 instead of the gate output signals GS1~GS8. The presence of the AND gates AND1~AND8, however, permits two or more delay periods in one positive half cycle of the high frequency signal. For example, as shown in FIG. 2B, two delay periods d1 and d2 are generated within the first positive half cycle of the high frequency signal.

The specific source signals, such as S24, S16, S8 and S0 used in the above embodiment, are required to be four clock cycles leading or lagging all the source signals inputted into the corresponding multiplexers. Such requirement is for avoiding the effect of the unused source signals on the first and the second output signals. For example, as shown in FIG. 5A, the eight source signals inputted into the multiplexer MUX2 are S27~S20, and the source signal S16 leading all the source signals S27~S20 by four clock cycles of the first clock signal is selected as the specific source signal to be inputted in and operated by the AND gate AND2. Accordingly, when the specific source signal S16 is at a low level, the gate output signal GS2 is assured to be at a low level no matter what the states of the eight source signals S27~S20 are. In other words, the source signals S27~S20 have no effect on the electric state of the first output signal. In another example, as shown in FIG. 5B, the eight source signals inputted into the multiplexer MUX7 are S19~S12, and the source signal S8 leading all the source signals S19~S12 by four clock cycles of the second clock signal is selected as the specific source signal to be inputted in and operated by the AND gate AND7. Accordingly, when the specific source signal S8 is at a low level, the gate output signal GS7 is assured to be at a low level no matter what the states of the eight source signals S19~S12 are. In other words, the source signals S19~S12 have no effect on the electric state of the second output signal.

Figure 6:
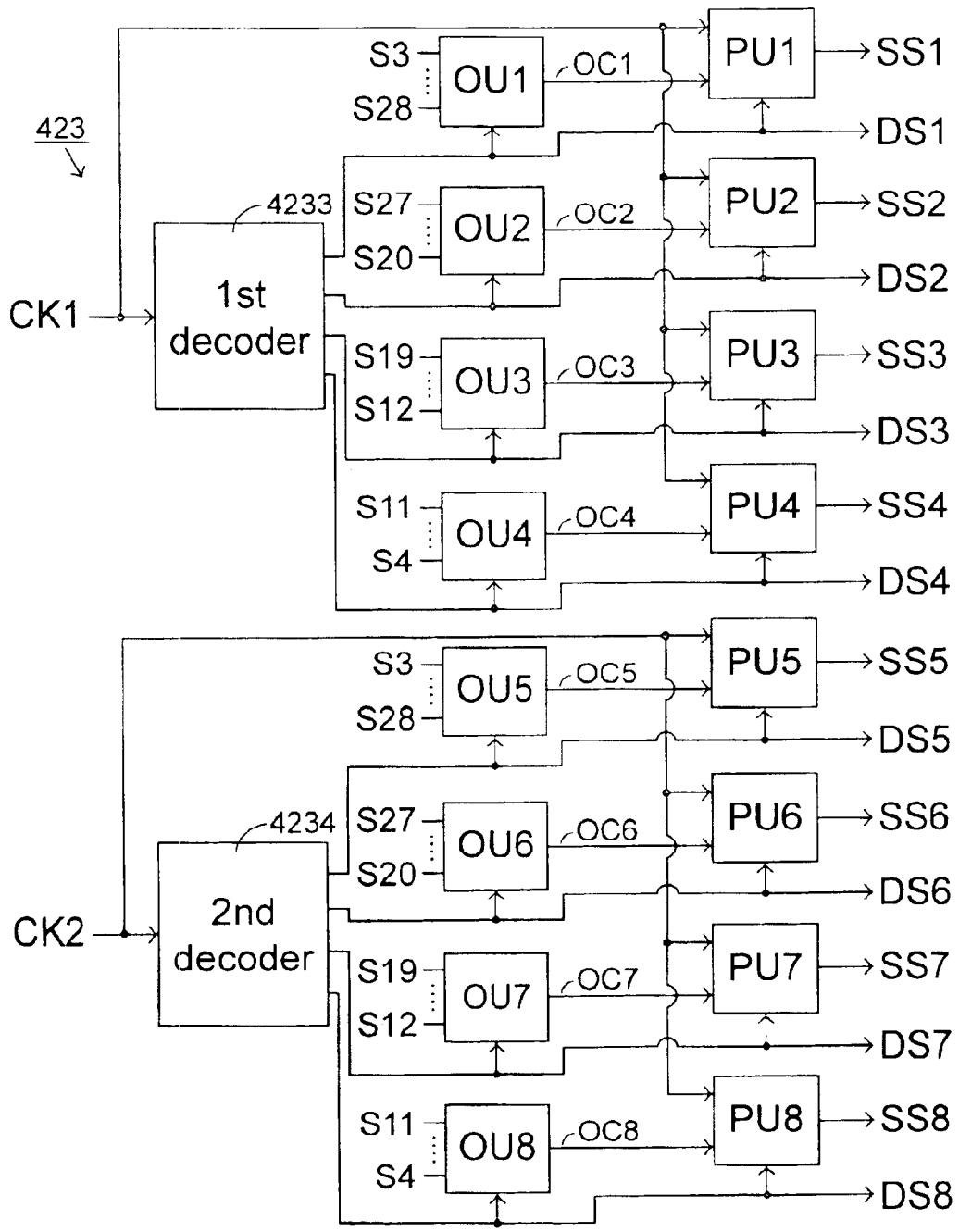
FIG. 6 is a block diagram schematically showing the selection signal generating circuit of FIG. 5A.

The decoding signals DS1~DS8 are generated by the selection-signal generating circuit 423, which will be described herein with reference to FIG. 6. The selection-signal generating circuit 423 includes a first and a second selection signal decoder 4233 and 4234. The first selection signal decoder 4233 is coupled to four operating units OU1, OU2, OU3 and OU4 and four output units PU1, PU2, PU3 and PU4, and the second selection signal decoder 4234 is coupled to four operating units OU5, OU6, OU7 and OU8 and four output units PU5, PU6, PU7 and PU8. In response to the first and the second clock signals, decoding signals DS1~DS4 and decoding signals DS5~DS8 are generated by the first and the second selection signal decoder 4233 and 4234, respectively. The decoding signals DS1~DS4 are inputted into the four operating units OU1, OU2, OU3 and OU4 along with the four sub-groups of source signals to generate four output control signals OC1, OC2, OC3 and OC4, respectively. For example, the output control signal OC1 is outputted by the operating unit OU1 in response to the decoding signal DS1 and the source signals S3, S2, S1, S0, S31, S30, S29 and S28. Likewise, the decoding signals DS5~DS6 are inputted into the four operating units OU5~OU8 along with the four corresponding sub-groups of source signals to generate four output control signals OC5, OC6, OC7 and OC8, respectively. Then, the output units PU1~PU8 coupled to the operating units OU1~OU8 receive the output control signals OC1~OC8 and the decoding signals DS1~DS8, and output the selection signals SS1~SS8 to the multiplexers MUX1~MUX8 in response to the first and the second clock signals, respectively. The decoding signals DS1~DS8 are further transmitted to the AND gates AND1~AND8 for the operations mentioned above with reference to FIGS. 5A and 5B.

In this embodiment, each of the operating units OU1~OU8 can be an OR gate to perform OR operation of the eight source signals belonging to the same sub-group. Each of the output units PU1~PU8 can be a transparent latch.

Figure 7A:
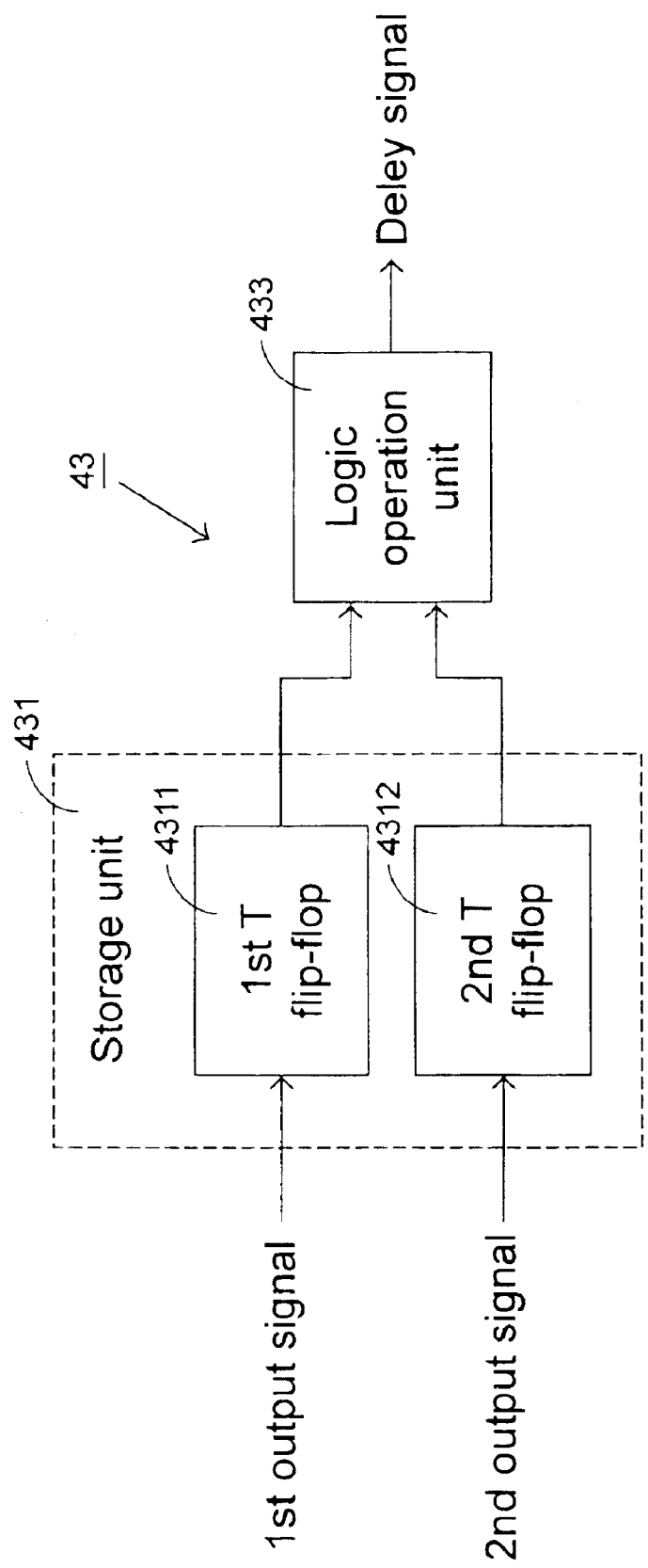
FIG. 7A is a block diagram schematically showing an example of the storage unit for use in the logic operator of FIG. 4.

After the first and the second output signals are obtained, they are inputted into the logic operator 43, as shown in FIG. 4, to be logically operated, thereby obtaining the delay signal with desired delay length. Please refer to FIG. 7A. The logic operator 43 includes a storage unit 431 and a logic operation unit 433. The storage unit 431 includes a first and a second T flip-flops 4311 and 4312 for respectively storing therein the first and the second input signals received from the source-signal selector 42. The first and the second output signals are then processed by an XOR operation in the logic operation unit 433 that is implemented by an XOR gate.

Figure 7B:
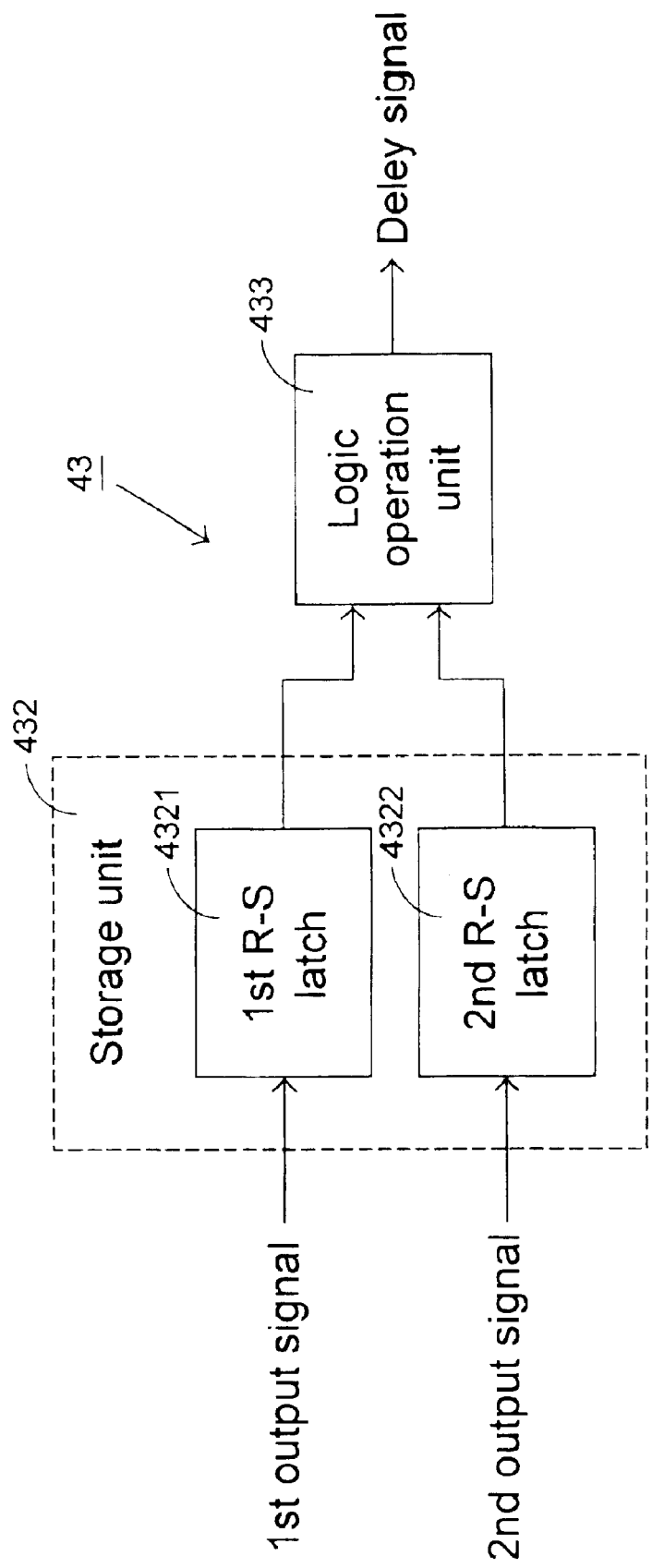
FIG. 7B is a block diagram schematically showing another example of the storage unit for use in the logic operator of FIG. 4

Another embodiment of the logic operator 43 is shown in FIG. 7B. The logic operator 43 includes a storage unit 432 and a logic operation unit 433. The storage unit 432 includes a first and a second R-S latches 4321 and 4322 for respectively storing therein the first and the second input signals received from the source-signal selector 42. The first and the second output signals are then processed by an XOR operation in the logic operation unit 433 that is implemented by an XOR gate.

By using the present method and device to generate a delay signal, the delay signal is accurate, and the delay period is adjustable. Therefore, the desired constant phase difference between the cross-chip signals in a high-frequency system can be assured of.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for generating a delay signal, comprising steps of:
providing a plurality of source signals, every adjacent two of which have a phase difference of a certain clock unit;
duplicating said source signals to obtain a first and a second signal groups;
generating a first and a second output signals at a first and a second time points based on said first and said second signal groups, respectively; and
processing said first and said second output signals by a logic operation to obtain said delay signal.

2. The method according to claim 1, wherein said plurality of source signals are generated from a high-frequency signal by a phase-locked loop (PLL) device.

3. The method according to claim 1, wherein said plurality of source signals are a series of increasingly lagging signals.

4. The method according to claim 1, wherein said plurality of source signals are a series of increasingly leading signals.

5. The method according to claim 1, wherein said logic operation is an XOR operation.

6. The method according to claim 1, wherein said step of generating said first and said second output signals comprises sub-steps of:
selecting a signal from said first signal group at said first time point as said first output signal; and
selecting a signal from said second signal group at said second time point as said second output signal.

7. The method according to claim 6, wherein said first and said second time points are predetermined, and located by counting operations in response to a first and a second clock signals, respectively.

8. The method according to claim 6, wherein said first and said second signal groups are divided into a first and a second plurality of signal sub-groups, and said first and said second output signals are generated from one of said first plurality of signal sub-groups and one of said second plurality of signal sub-groups, respectively.

9. The method according to claim 8, wherein all source signals in the selected one of said first plurality of signal sub-groups are at the same first level at said first time point, and all source signals in the selected one of said second plurality of signal sub-groups are at the same second level at said second time point.

10. The method according to claim 9, wherein said first and said second levels are both low levels.

11. The method according to claim 1, wherein said first output signal is generated based on the same first edges of selected two of said first signal group, and said second output signal is generated based on the same second edges of selected two of said second signal group.

12. The method according to claim 11, wherein said first and said second edges are both rising edges.

13. The method according to claim 11, wherein a delay period of said delay signal is determined by the same third edges of said first and said second output signals.

14. The method according to claim 13, wherein said third edges are rising edges or falling edges.

15. A device for generating a delay signal, comprising:
a source-signal generator generating and outputting N counts of source signals in response to a high frequency signal, every adjacent two of said N counts of source signals having a phase difference of a certain clock unit;
a source-signal selector coupled to said source-signal generator, and selecting a first and a second ones of said N counts of source signals to be outputted at a first and a second time points in response to a first and a second clock signals as a first and a second output signals, respectively, and
a logic operator coupled to said source-signal selector, and logically operating said first and said second output signals to obtain said delay signal.

16. The device according to claim 15, wherein said source-signal generator is a phase-locked loop (PLL) device.

17. The device according to claim 15, wherein said source-signal selector includes:
a selection-signal generating circuit generating a first and a second selection signal sets in response to said N counts of source signals and said first and said second clock signals;

a first multiplexing circuit coupled to said selection-signal generating circuit, and allowing said first one of said N counts of source signals to be outputted as said first output signal in response to said first selection signal; and a second multiplexing circuit coupled to said selection-signal generating circuit, and allowing said second one of said N counts of source signals to be outputted as said second output signal in response to said second selection signal.

18. The device according to claim 17, wherein said first multiplexing circuit includes M1 counts of multiplexers receiving different portions of said N counts of source signals, respectively, and allowing M1 ones among said N counts of source signals to be outputted as M1 counts of multiplexing output signals in response to M1 counts of selection signals included in said first selection signal set, and said second multiplexing circuit includes M2 counts of multiplexers for receiving different portions of said N counts of source signals, respectively, and allowing M2 ones among said N counts of source signals to be outputted as M2 counts of multiplexing output signals in response to M2 counts of selection signals included in said second selection signal set.

19. The device according to claim 18, wherein said source-signal selector further includes:

a first signal synthesizing circuit coupled to said first multiplexing circuit for synthesizing said M1 counts of multiplexing output signals into said first output signal; and a second signal synthesizing circuit coupled to said second multiplexing circuit for synthesizing said M2 counts of multiplexing output signals into said second output signal.

20. The device according to claim 19, wherein each of said first and said second signal synthesizing circuits includes an OR gate.

21. The device according to claim 19, wherein said first signal synthesizing circuit includes:

M1 counts of AND gates coupled to said selection-signal generating circuit, said M1 counts of multiplexers and said source-signal generator, performing an AND operation of M1 counts of decoding signals, said M1 counts of multiplexing output signals and M1 counts of specific signals, and outputting M1 counts of gate output signals, respectively; and a first OR gate coupled to said M1 counts of AND gates, and performing a first OR operation of said M1 counts of gate output signals to obtain said first output signal, and said second signal synthesizing circuit includes:

M2 counts of AND gates coupled to said selection-signal generating circuit, said M2 counts of multiplexers and said source-signal generator, performing an AND operation of M2 counts of decoding signals, said M2 counts of multiplexing output signals and M2 counts of specific signals, and outputting M2 counts of gate output signals, respectively; and a second OR gate coupled to said M2 counts of AND gates, and performing a second OR operation of said M2 counts of gate output signals to obtain said second output signal.

22. The device according to claim 21, wherein each of said M1 counts of specific signals is identical to one of said source signals, and kept at least P counts of clock cycles of said first clock signal leading or lagging all said source signals inputted into the corresponding multiplexer, and each of said M2 counts of specific signals is identical to one of said source signals, and kept at least P counts of clock cycles of said second clock signal leading or lagging all said source signals inputted into the corresponding multiplexer.

23. The device according to claim 22, wherein the number N, M1, M2 and P are 32, 4, 4, and 4, respectively.

24. The device according to claim 17, wherein said selection-signal generating circuit comprises:

a first selection signal decoder generating said M1 counts of decoding signals in response to said first clock signal;

M1 counts of operating units, each coupled to said first selection signal decoder and outputting an output control signal in response to one of said M1 counts of decoding signals and (N/M1) ones of said N counts of source signals;

M1 counts of output units, each coupled to said first selection signal decoder and one of said M1 counts of operating units, and outputting one of said M1 counts of selection signals in response to said first clock signal, one of said M1 counts of decoding signals and one of said M1 counts of output control signals;

a second selection signal decoder generating said M2 counts of decoding signals in response to said second clock signal;

M2 counts of operating units, each coupled to said second selection signal decoder and outputting an output control signal in response to one of said M2 counts of decoding signals and (N/M2) ones of said N counts of source signals; and M2 counts of output units, each coupled to said second selection signal decoder and one of said M2 counts of operating units, and outputting one of said M2 counts of selection signals in response to said second clock signal, one of said M2 counts of decoding signals and one of said M2 counts of output control signals.

25. The device according to claim 24, wherein each of said M1 counts of operating units is an OR gate for performing an OR operation of said (N/M1) ones of said N counts of source signals, and each of said M2 counts of operating units is an OR gate for performing an OR operation of said (N/M2) ones of said N counts of source signals.

26. The device according to claim 24, wherein each of said M1 and M2 counts of output units is a transparent latch.

27. The device according to claim 15, wherein said logic operator comprises:

a storage unit for storing therein said first and said second output signals; and a logic operation unit coupled to said storage unit and logically operating said first and said second output signals to obtain said delay signal.

28. The device according to claim 27, wherein said storage unit includes a first and a second T flip-flops for storing therein said first and said second output signals, respectively.

29. The device according to claim 27, wherein said storage unit includes a first and a second R-S latches for storing therein said first and said second output signals, respectively.

30. The device according to claim 27, wherein said logic operation unit is an XOR gate.

31. A method for generating a delay signal, comprising steps of:

provi ding a plurality of source signals, every adjacent two of which have a phase difference of a certain clock unit;

generating a first and a second output signals at a first and a second time points based on said plurality of source signals, wherein said first and said second time points are predetermined and located by counting operations in response to a first and a second clock signals, respectively; and processing said first and said second output signals by a logic operation to obtain said delay signal.

* * * * *